(12) United States Patent
Nakanishi et al.

(10) Patent No.: US 6,283,380 B1
(45) Date of Patent: Sep. 4, 2001

(54) AIR CONDITIONING SYSTEM AND AIR CONDITIONING METHOD

(75) Inventors: Tohru Nakanishi, Moriyama; Hirohito Terada, Shiga-ken; Motokazu Kawase, Yohkaichi, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/531,040

(22) Filed: Mar. 20, 2000

(30) Foreign Application Priority Data

Mar. 25, 1999 (JP) .................................................. 11-82066

(51) Int. Cl.[7] .................................................. F25D 17/00
(52) U.S. Cl. ......................... 236/49.3; 236/51; 454/258; 62/179
(58) Field of Search ................................. 236/49.3, 49.1, 236/51; 62/179, 180, 186; 454/75, 258

(56) References Cited

U.S. PATENT DOCUMENTS

| | | | |
|---|---|---|---|
| 5,326,028 | * | 7/1994 | Kano et al. ......................... 236/49.3 |
| 5,331,825 | * | 7/1994 | Kim ................................. 454/258 X |
| 5,815,078 | * | 9/1998 | Mun et al. ......................... 236/51 X |
| 5,875,639 | * | 3/1999 | Kim et al. ............................... 62/186 |

FOREIGN PATENT DOCUMENTS

| | | |
|---|---|---|
| 2-187552 | 7/1990 | (JP) . |
| 5-288366 | 11/1993 | (JP) . |
| 7-86268 | 9/1995 | (JP) . |

OTHER PUBLICATIONS

Hayashi et al., "Self Hot–Spot Sensing and Self Air Flow Direction Controlled Air Moving Device," IBM Technical Disclosure Bulletin, vol. 40, No. 12, pp. 213–214 (Dec. 1997).

* cited by examiner

*Primary Examiner*—Harry B. Tanner
(74) *Attorney, Agent, or Firm*—Louis J. Percello

(57) ABSTRACT

An air conditioning system and an air conditioning method are disclosed for quickly and effectively controlling the temperature in a room requiring cooling and keeping the room at a uniform temperature. The present invention estimates a temperature distribution in a room through a simulation and controls airflow rates and airflow directions of a plurality of fans on the basis of the simulation result. Temperature sensors are arranged at predetermined positions in a room such as a computer room. A simulation is performed on the basis of temperatures detected by the temperature sensor Sn and the current airflow rates and airflow directions of a plurality of fans to obtain a temperature distribution in the room. It is determined whether obtained temperatures are in a predetermined temperature range. As the result of such determination, at least one of airflow rate and airflow direction of a fan which covers a position being at a temperature out of the predetermined temperature range is controlled. It is preferable to use an underfloor fan that can be fitted into the floor of the computer room.

15 Claims, 4 Drawing Sheets

AIR CONDITIONING SYSTEM AND AIR CONDITIONING METHOD

FIELD OF THE INVENTION

The present invention relates to an air conditioning system and an air conditioning method, more specifically to an air conditioning system and an air conditioning method to be suitably applied to a computer room.

BACKGROUND OF THE INVENTION

In a computer room including various units acting as heat generating sources, such as a computer, display monitor, printer, magnetic recorder, and communication controller, it is necessary to perform air conditioning in order to keep the optimum operation environment and working environment. To air-condition a computer room, one or more air conditioners are generally used for supplying cooling air and manually controlling the airflow rate(s) and airflow direction(s) of the air conditioner(s) on the basis of temperatures detected by temperature sensors provided at selected positions in the room.

However, the above manual method is not suitable for an unattended computer room. Moreover, flows of the cooling air in a computer room are delicately changed depending on the number, dimensions, and arrangement state of units, such as computers and peripheral units (hereafter referred to as computer system units). Furthermore, the heat generated depends on not only a unit but also an operation state such as a high-speed operation or low-speed operation.

As a result, temperature distributions in a computer room can always be changed. Particularly, stagnancy of a high temperature occurs in a relatively narrow region and the stagnancy almost unexpectedly moves. Moreover, when supplying cooling air toward a certain high-temperature region, other areas may become high-temperature. Therefore, in fact, it is not easy to quickly uniform the temperature distribution in a computer room and keep the state. Therefore, there is a need for an automatic control technique for quickly responding to the fluctuation of temperature distribution in a computer room, properly controlling a temperature, and keeping an optimum temperature state.

Therefore, it is an object of the present invention to provide an air conditioning system capable of effectively controlling air-conditioning of a room requiring cooling. It is another object of the present invention to provide an air conditioning system and method for effectively achieving air conditioning of a room including computer system units.

SUMMARY OF THE INVENTION

The present invention estimates the temperature distribution state in a room using a simulation and controls the airflow rate and airflow direction of a plurality of fans on the basis of the result of the simulation. A plurality of temperature sensors are provided at a plurality of predetermined positions in a room such as a computer room. A simulation is performed on the basis of temperatures detected by the temperature sensors and the current airflow rates and airflow directions of the fans to obtain temperatures at a plurality of positions in the room. It is determined whether the temperatures obtained through the simulation are kept in a predetermined temperature range. As the result of the determination, at least one of the airflow rate and airflow direction of at least one selected fan covering a position being at a temperature out of the predetermined temperature range is controlled. It is preferable that a fan is an underfloor fan that can be fitted into the floor of the computer room.

A more complete understanding of the present invention, as well as further features and advantages of the present invention, will be obtained by reference to the following detailed description and drawings.

DETAILED DESCRIPTION OF PREFERRED EMBODIMENTS

Figure 1:
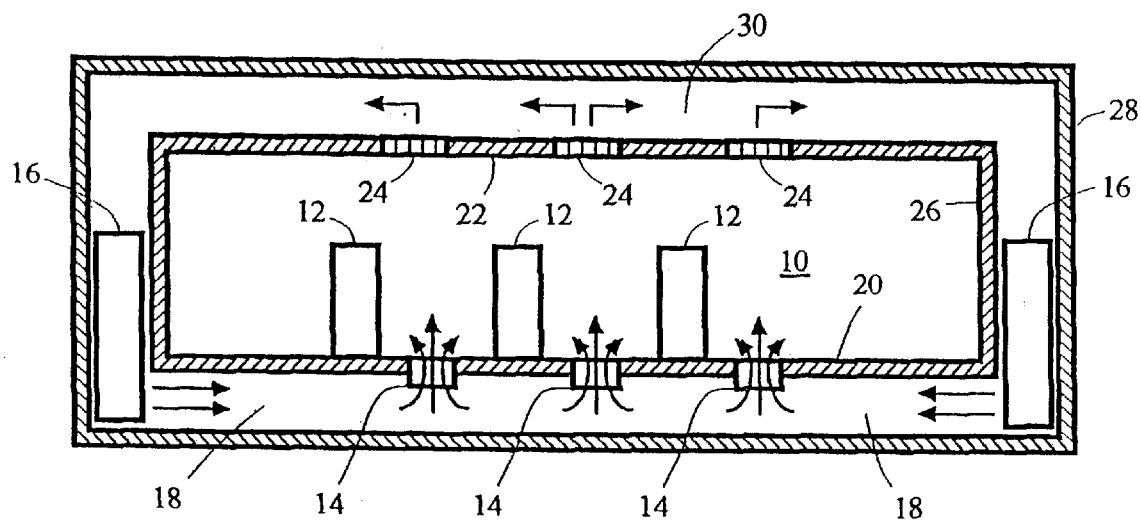
FIG. 1 is a diagram schematically showing a computer room.

A preferred embodiment will be described below by referring to the accompanying drawings. FIG. 1 schematically shows a computer room for which an air conditioning system of the present invention can be used. Computer system units 12 including a computer and peripheral units are arranged in a computer room 10. A plurality of underfloor fans 14 are set to a floor 20.

Two air conditioners 16 are arranged in the spaces between room walls 26 and outer walls 28 of the computer room 10, to supply cooling air to a space 18 under the floor. The cooling air supplied from the air conditioners 16 is sent to the computer room 10 by fans 14. The air in the computer room 10 flows to a space 30 on a ceiling through exhaust ports 24 provided at the ceiling 22 and then returns to the air conditioners 16.

Figure 2:
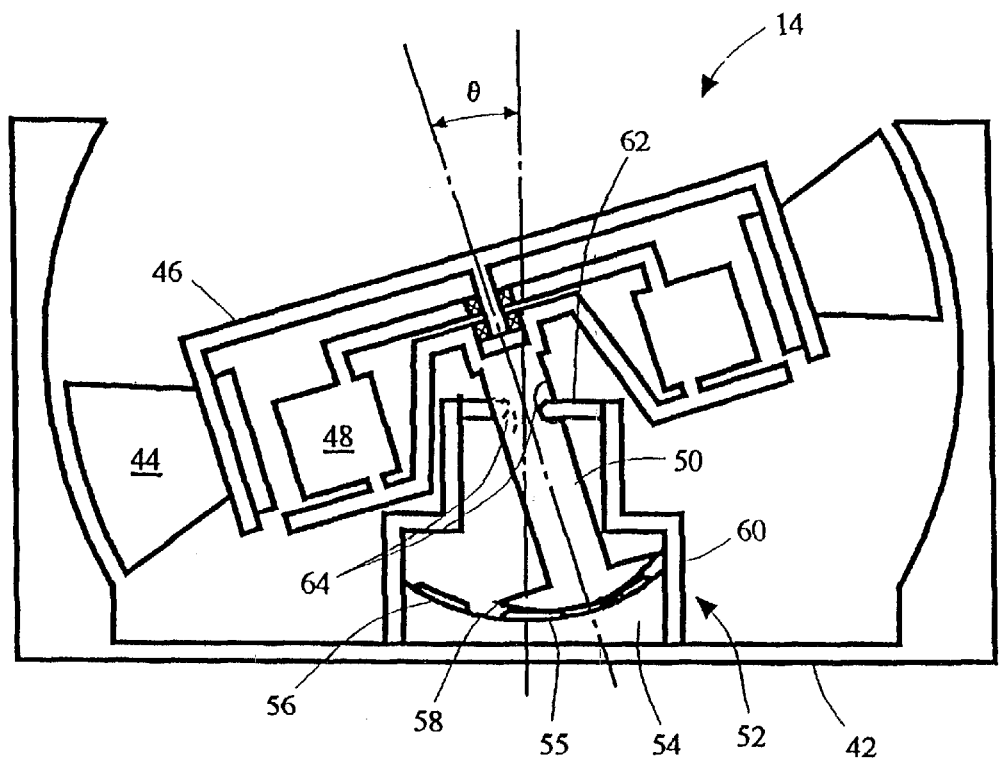
FIG. 2 is a diagram showing an underfloor fan usable for the present invention.

It is preferable that the fan 14 used for the present invention is a movable fan controllable in airflow rate and airflow direction. An example of such a fan is disclosed in IBM TDB (Technical Disclosure Bulletin), Vol. 40, No. 12, Dec. 1997, pp. 213–214, "Self Hot-Spot Sensing and Self Air Flow Direction Controlled Air Moving Device." FIG. 2 shows a fan that is similar to the fan disclosed in this TDB. The moving part of the fan 14 is supported by a housing 42. The moving part is configured by a plurality of blades, such as four blades 44, a fan motor rotor 46 provided with the blades 44, a fan motor stator 48, and a movable shaft 50. The stator 48 and the movable shaft 50 are integrally formed.

The movable shaft 50 is movably supported by an airflow-direction control section 52 fixed to the housing 42. The airflow-direction control section 52 has a frame 60 fixed to the housing 42 and the frame 60 has a structure for movably supporting the movable shaft 50. The support structure can be an any suitable structure. In case of this example, four support shafts 62 arranged at 90° from each other support the movable shaft 50. In FIG. 2, only two support shafts 62 are shown. The movable shaft 50 has four shallow recesses 64 slightly larger than the support shaft 62 and formed so as to respectively receive the end of the support shaft 62. The ends of the support shafts 62 are received by the four recesses 64 to support the movable shaft 50.

The airflow-direction control section 52 has an airflow-direction control stator 54 formed concavely. The movable shaft 50 has a lower end 58 convexly formed so as to fit with the concave face of the stator 54. A magnet is set to the bottom of the lower end 58 so that one magnetic pole appears. The stator 54 includes a central stator windings 55 and a plurality of stator windings 56 formed so as to surround the central stator windings 55. When the stator winding is driven it works as the other magnetic pole and exerts attraction to the magnet of the convex end 58. An undriven stator winding remains as one magnetic pole and provides repulsion for the magnet of the convex end 58.

Therefore, by selectively driving the stator windings 55 and 56, it is possible to select the inclination θ and a rotation angle of the fan and control the airflow direction of the fan. By arranging the stator windings in two or more concentric rings or increasing the number of stator windings, it is possible to finely control the inclination angle θ and the rotation angle. An airflow rate is controlled by controlling the fan motor to adjust the revolving speed of the rotor 46.

The fan 14 in FIG. 2 is removably set to the floor of a computer room. To make air supply easy, it is preferable to set the housing 42 of the fan to a mesh plate (cut tile) and fit the mesh plate into the floor. It is also possible to set the fan on the ceiling or sidewall of the computer room. However, it has been found that it is advantageous to set the fan to the floor in order to improve the cooling efficiency and remove the stagnation of a high temperature.

Figure 3:
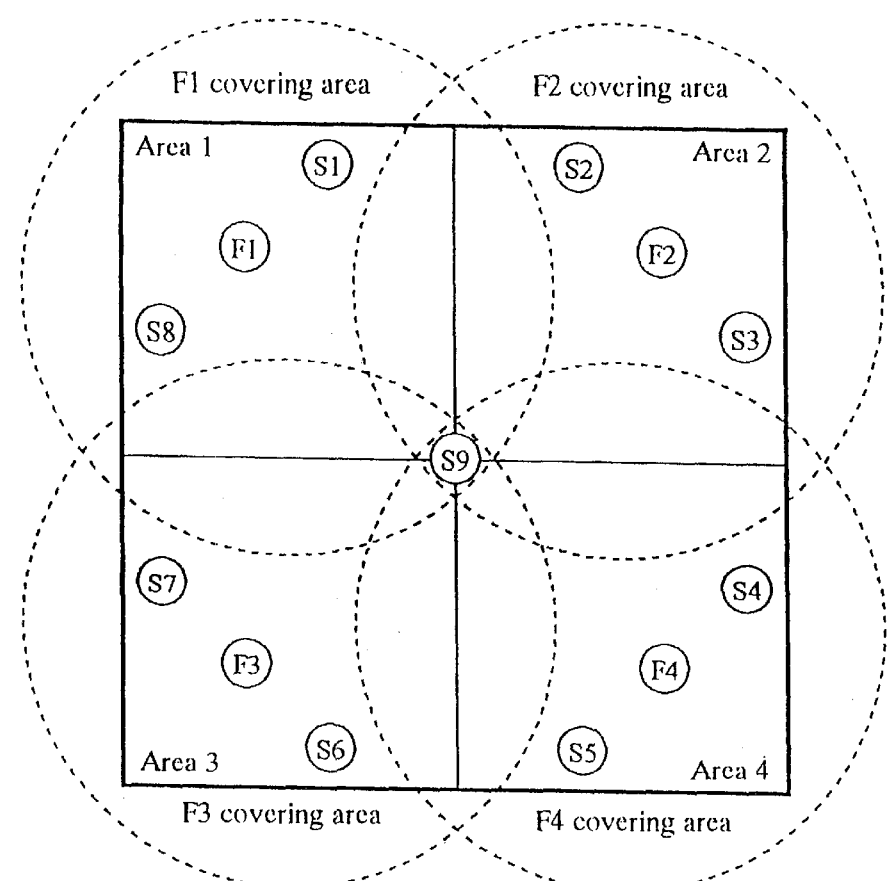
FIG. 3 is a diagram conceptually showing cooling by fans.
Figure 4:
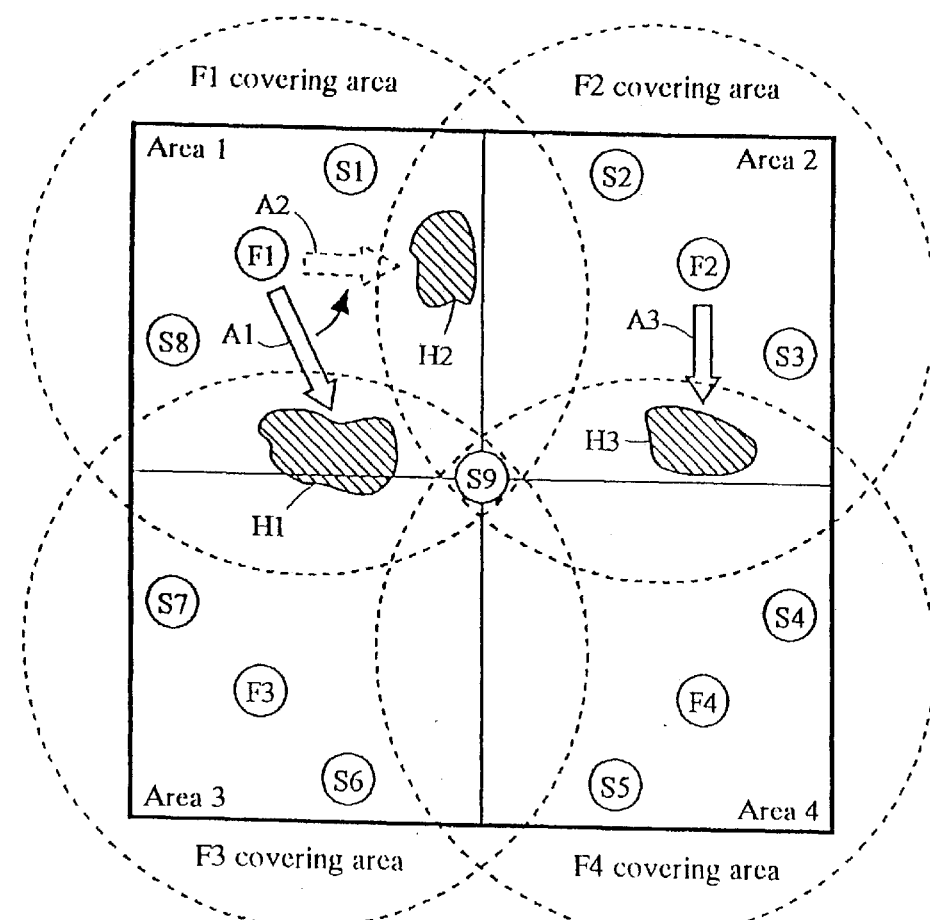
FIG. 4 is a diagram conceptually showing cooling of high-temperature regions by fans.

FIGS. 3 and 4 show the concept of air conditioning according to the present invention. Four fans F1 to F4 are set to the floor of a computer room and each fan covers a region enclosed by a dotted-line circle. A region in which circles are overlapped is covered with associated fans. In FIGS. 3 and 4, it is assumed that the computer room has four regions (area 1, area 2, area 3, and area 4). It is necessary to select the number of and positions of fans so that every region of the computer room is covered with any fan. In FIGS. 3 and 4, it is assumed that four fans are symmetrically arranged for simplification. However, as described later, it is actually possible to properly select the number of and positions of fans on the basis of installation positions of computer system units. A plurality of temperature sensors S1 to S9 are arranged at selected positions of the computer room. The temperature sensors are set at positions at a height of, for example, 1.3 m from the floor surface.

According to the present invention, a simulation is performed on the basis of the detected temperatures and the current airflow rates and airflow directions of the fans to obtain the temperature distribution in the computer room. When a region H1 is determined to be a high-temperature region as the result of the simulation as shown in FIG. 4, the fan F1 covering the region H1 is controlled so as to supply cooling air toward the high-temperature region H1 as shown by a solid line arrow A1.

After a certain time passes, a simulation is performed again on the basis of the temperature sensors and the current airflow rates and airflow directions to obtain a temperature distribution. When it is determined as the result of the simulation that the temperature of the region H1 has lowered to a preset temperature range and a region H2 is at a high-temperature, the fan F1 is then controlled so as to supply cooling air toward the region H2 as shown by a broken-line arrow A2. Though the region H2 is also covered with the fan F2, the fan F1 is used because it is more efficient to use the fan F1. At the next cycle, a simulation is performed again on the basis of the detected temperatures and the current airflow rates and airflow directions. When it is determined as the result of the simulation that the high temperature of the region H2 still continues, the fan F1 is continuously operated toward the region H2. When it is determined in the next cycle that the temperature of the region H2 has lowered to a set temperature range and a region H3 is at a high temperature, the fan F2 is controlled so as to supply air toward the region H3.

Figure 5:
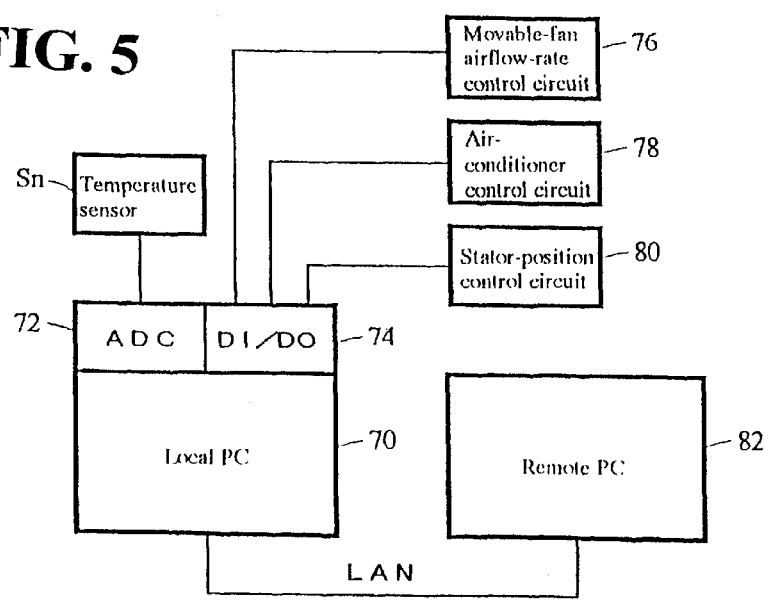
FIG. 5 is a diagram showing the air conditioning system of an embodiment of the present invention.

FIG. 5 illustrates the configuration of an air conditioning system according to the present invention. A plurality of temperature sensors Sn supply temperature information to a local personal computer (PC) 70 through an analog-digital converter (ADC) 72. A data input/output port (DI/DO) 74 of the local PC 70 is connected to a movable-fan airflow-rate control circuit 76, an air-conditioner control circuit 78, and a movable-fan stator-position control circuit 80.

The airflow-rate control circuit 76 controls the revolving speed of a designated fan 14 under the control of the local personal computer 70 to control the airflow rate, that is, the airflow force. The air-conditioner control circuit 78 controls the air conditioners 16 on the basis of a temperature state. For example, the circuit 78 temporarily stops air conditioners when the temperatures in a computer room are lower than a predetermined temperature range or operates the air conditioners 16 at a high power when the cooling effect by fans is too low. The stator-position control circuit 80 selectively drives the windings 55 and 56 of the stator 54 of a designated fan 14 under the control of the local PC 70 to control the airflow direction of the fan.

The local PC 70 is set in a computer room and connected to a remote PC 82 through a LAN (Local Area Network). The remote PC is set, for example, in a monitoring room in the same site. This configuration is suitable for monitoring in a separate monitoring room a temperature state of an unattended computer room. The remote PC 82 includes a simulation program for monitoring a temperature distribution. The local PC 70 includes an air-conditioning control application program for controlling the entire cooling-control process on the basis of temperatures obtained by the simulation program.

Next, an embodiment of a cooling-control process flow will be described by referring to FIG. 6. The operation starts when power is turned on. The local PC 70 includes a fan operation status table (hereafter referred to as table 1) and a fan region coverage table (hereafter referred to as table 2) in its memory. When it is assumed that there are four fans F1 to F4, the fan operation status table includes entries of airflow rate, airflow direction, and designation wait flag for each fan as shown below. When it is assumed that a computer room is divided into four regions (area 1, area 2, area 3, and area 4), the fan region coverage table includes the indication of a region covered by each fan as shown in table 2 below.

TABLE 1

Fan operation status table

| Fan number | Airflow rate | Airflow direction | Designation wait flag |
|---|---|---|---|
| F1 | | | |
| F2 | | | |
| F3 | | | |
| F4 | | | |

TABLE 2

Fan region coverage table

| Fan number | Region to be covered |
|---|---|
| F1 | Area 1 |
| F2 | Area 2 |
| F3 | Area 3 |
| F4 | Area 4 |

The designation wait flag is set to "0" when the airflow rate and/or airflow direction of an associated fan is controlled and set to "1" when fan control is unnecessary. A fan with its designation wait flag set to "0" cannot accept the next control designation until the temperature of a portion whose temperature is currently controlled by the fan returns to a predetermined temperature range. A fan with its designation wait flag set to "1" can accept a control designation at any time.

In block 100, the local PC 70 receives the initial information of airflow rate and airflow direction from each fan to update the table 1. When it is assumed that there are three levels of strong, middle, and weak in the airflow rate of the fan, the initial airflow rate is usually set to "weak." The airflow direction of a fan can be detected by a position sensor such as an optical sensor which detects the movement of the lower end 58 of the movable shaft 50 (FIG. 2). Alternatively, it is possible to use a known proper detection device such as a limit switch.

In block 102, the local PC 70 collects temperature values from all the temperature sensors Sn. The local PC 70 sends the collected temperature values and the data of the current airflow rate and airflow direction of each fan to the remote PC 82.

In block 104, the remote PC 82 performs a simulation on the basis of the temperature values and the current airflow rate and airflow direction of each fan to obtain a temperature distribution in the computer room. As a temperature-distribution simulation program, it is possible to use any suitable temperature-distribution analysis program that is commercially available. An example of such program is the temperature distribution analysis simulation program FLO-THERM™ made by FLOMERICS, Inc. in Britain. The remote PC 82 calculates a temperature distribution in the computer room through the simulation. For example, the temperature is calculated for each grid position which is obtained by dividing the area of the computer room into a grid at an interval, for example, of 1 m in length and width directions. A grid position provides a coordinate position. It is preferable to obtain a temperature distribution by sampling at a height (e.g. 1.3 m) where a temperature sensor is set. The remote PC 82 transfers the obtained temperature distribution values to the local PC 70 together with coordinate position data for the temperature distribution values.

In block 106, the local PC 70 including an air-conditioning control application program determines whether the temperature distribution values include a temperature out of a preset temperature range. If a determination result is NO, the process proceeds to block 108. In block 108, the designation wait flag of every fan in the table 1 is set to "1."

In block 110, a predetermined time interval for latency, e.g., approximately 5 minutes is set. Because it takes time until an effect appears after control of airflow rate and airflow direction is started, an interval corresponding to the latent time is set. The interval defines a basic cycle for temperature control. It is possible to properly select an interval on the basis of an operation environment. When the interval set in block 110 passes, the process returns to block 102 to repeat the above steps. When a determination result is YES in block 106, the process proceeds to block 112. Block 112 shows start of fan control and block 114 is started.

In block 114, it is determined whether the temperature of the portion temperature-controlled in the previous cycle is in a set temperature range. As described below, a fan is controlled so as to set an airflow direction to a grid or coordinate position at the center of a high-temperature region found through simulation. The designation wait flag related to a fan receiving a control designation is set to "0." The local PC 70 determines whether the temperature of the coordinate position at which an airflow direction was set in the previous cycle has fallen within the set temperature range. When the temperature is in the preset temperature range, it is unnecessary to temperature-control the coordinate position. Therefore, when the temperature of the coordinate position temperature-controlled in the previous cycle has been brought into the set temperature range, the local PC 70 sets the designation wait flag of the fan covering the coordinate position from "0" to "1."

In block 116, it is determined whether there exists in table 1 a designation wait flag set to "0" in the previous cycle but not set to "1" in block 114. The presence of such a designation wait flag shows that the temperature of a coordinate position to which an airflow direction was set has not yet been brought into the set temperature range. It is necessary to continue temperature control for such coordinate position. In block 116, it is determined whether there is a coordinate position requiring further temperature control. When a determination result is YES, the process proceeds to block 118.

In block 118, control is performed so as to keep the last state in order to continue the temperature control for the same coordinate position. That is, operations are continued while keeping the same airflow rate and airflow direction. Then, the process proceeds to block 110. If a determination result in block 116 is NO, the process proceeds to block 120.

In block 120, an area including a coordinate position being at a temperature out of the set temperature range and having a designation wait flag of "1" is considered. It is decided whether the temperature out of the set temperature range is lower than the lower limit of the set temperature range. When a determination result is YES, the process proceeds to block 122.

In block 122, such area and associated fan are identified on the basis of the coordinate position at a temperature lower than the set temperature range and values in the tables 1 and 2 to control the airflow rate of the associated fan so as to lower the rate by one level. Moreover, the data for airflow rate in table 1 is updated. If the fan operates at the level "weak," the fan is stopped. When temperatures of all the areas are lower than the set temperature range, it is possible to stop the air conditioners 16 and all the fans for a predetermined time or control them so that they are operated at a lower power.

In block 124, airflow-rate data is transmitted to a fan to be controlled and the process proceed to block 110. If a determination result is NO in block 120, block 126 is started. In block 126, it is determined whether there is a temperature higher than the upper limit of the set temperature range. If a determination result is NO, the process proceeds to block 110.

When a determination result is YES in block 126, block 128 is started. In block 128, the air-conditioning control application program identifies an area and a fan to be controlled, on the basis of the coordinate position being at a temperature higher than the set temperature range and tables 1 and 2. Only a fan with its designation wait flag of the table 1 set to "1" is selected. The airflow direction of the fan is decided on the basis of the high-temperature coordinate position. In this case, the coordinate position at the center of a high-temperature region is obtained and the airflow direction is set so as to supply air toward the central coordinate position. It is preferable that the central coordinate position coincides with the airflow direction. However, when it is impossible to continuously change the airflow direction of the fan, there may occur a case in which the airflow direction cannot coincide with the central coordinate position. However, because the fan has a large coverage, there is no problem when the central coordinate position is included in the coverage of the fan. Alternatively, an airflow direction may be set to the highest-temperature coordinate position in the high-temperature region, not the center of the region.

The local PC 70 supplies a signal for designating a fan to be controlled and a signal for designating raising an airflow rate to a level "middle" to the airflow-rate control circuit 76 (FIG. 5). When it is necessary to change airflow direction, the local PC 70 sends a signal for designating a fan and a signal for designating an airflow direction to the stator-position control circuit 80. Therefore, cooling air is supplied to the high-temperature region exceeding the set temperature range.

A case may occur in which a plurality of areas have a temperature exceeding the set temperature range. In this case, fans for covering the areas are controlled in parallel. Moreover, uncommonly, a plurality of high-temperature regions may simultaneously occur in one area like the high-temperature regions H1 and H2 of the area 1 in FIG. 4. When these high-temperature regions can be covered with only one fan assigned to the area, a higher-temperature region is selected as a region to be preferentially cooled. If there is a high-temperature region that can be covered with another fan, it is possible to cool the high-temperature region by the other fan.

In block 130, the airflow rate data and airflow direction data in the table 1 for the fan to be controlled are updated and a designation wait flag is set to "0." In block 132, airflow rate data and airflow direction data are transmitted to the fan to be controlled and the process proceeds to block 110.

A designation wait flag is set to "0" when an associated fan receives a control designation and is set to "1" in block 114 when the temperature of a coordinate position used to set the airflow direction of the associated fan enters the set temperature range. When the designation wait flag is set to "1" in block 114, the associated fan can immediately start the next temperature control operation. Therefore, if a temperature out of the set temperature range is detected at a coordinate position different from the above coordinate position in the same area, the temperature of the coordinate position is detected in block 120 or 126 and the fan for the same area is controlled so as to supply air to the different coordinate position as an airflow direction target.

Figure 6:
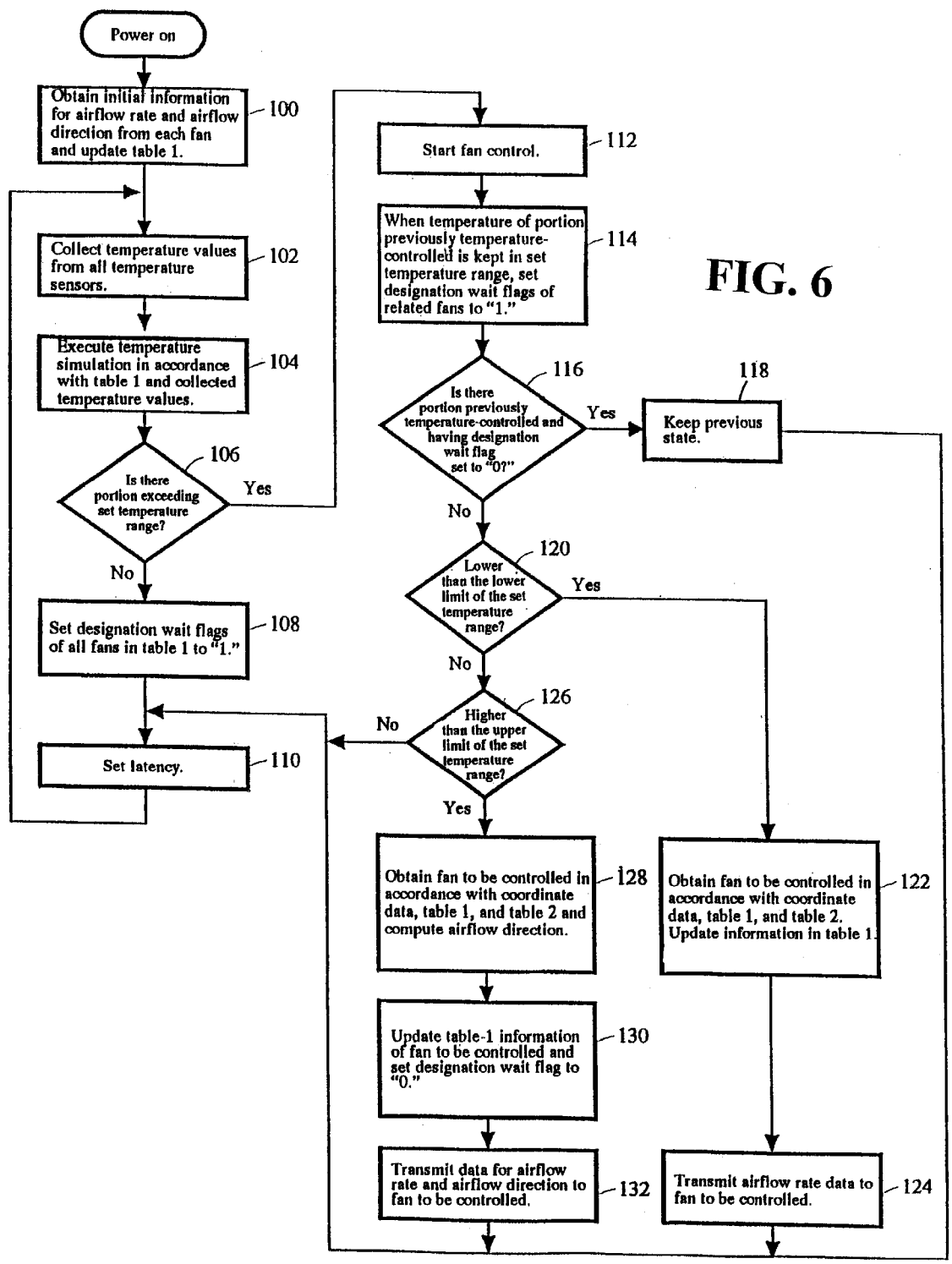
FIG. 6 is a diagram showing a cooling-control process flow by the present invention.

Therefore, according to the control flow in FIG. 6, a temperature state is cyclically monitored every interval set in block 110 and it is possible to quickly and properly control all areas so that temperatures of the areas are kept in the set temperature range. By image-displaying a simulated temperature-distribution state on a monitor in a monitoring room in which a remote PC is installed, it is possible to monitor the temperature of an unattended computer room and quickly deal with malfunction or failure of a fan or air conditioner.

In FIGS. 3 and 4, description has been made on the assumption that the fans F1 to F4 are symmetrically arranged in a computer room in order to show the concept of the present invention. In fact, types, the number, arrangement, and shapes of computer system units arranged in a computer room may vary. Therefore, the number of fans and positions where the fans are placed should be properly set on the basis of an actual state. However, if all areas requiring cooling in a computer room are covered with fans, and air conditioners and fans have cooling capacities capable of controlling the temperature in the computer room to a desired temperature range, the number of fans and their arrangement positions are not strict.

Figure 7:
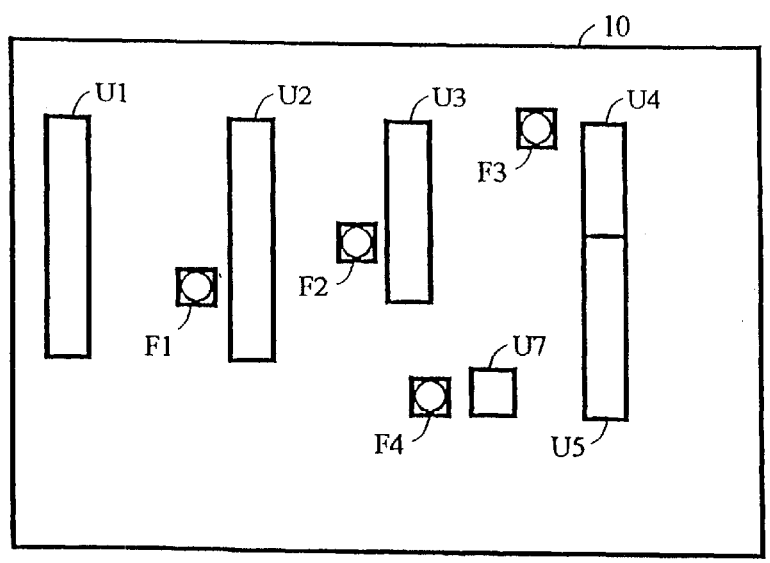
FIG. 7 is a diagram showing a layout in a computer room.

FIG. 7 shows an example of the arrangement of computer system units and underfloor fans in a computer room 10. Computer system units U1 to U5 are arranged on the basis of layout design and fans F1 to F4 are arranged at positions capable of covering these units. It is preferable to form a lot of fan setting ports in the floor so as to be adaptable to a case in which layouts of units are changed or a case in which it is necessary to change positions of fans on the basis of an actual operation result.

A temperature-distribution analysis program simulates a temperature distribution by using the temperatures of selected positions and the airflow rates and airflow directions of fans as main input parameters. However, the temperature distribution may change on the basis of other factors such as the size of a computer room or the heat produced by, the number of, arrangement of, or dimensions of units. It has been found that a temperature distribution very close to a measured value can be estimated by inputting such factors to the program as initial conditions and making evaluation and correction based on experiments. Though the number of and positions of temperature sensors are not strict, it is generally preferable to set the sensors on the wall and poles of a computer room at an equal interval.

A specific embodiment of the present invention has been described above. However, it will be understood that various modifications of the present invention may be made. For example, though the embodiment uses the combination of a local PC and a remote PC connected to LAN, it is also possible to perform control with one processor.

According to the present invention which obtains a temperature distribution through a simulation and optimally controls a plurality of fans on the basis of the temperature distribution, it is possible to control the temperature in a computer room very efficiently and quickly and keep the computer room at a uniform temperature. Moreover, it is possible to effectively control a temperature with the minimum numbers of temperature sensors and fans. Therefore, the present invention is economic and effective for power saving.

It is to be understood that the embodiments and variations shown and described herein are merely illustrative of the principles of this invention and that various modifications may be implemented by those skilled in the art without departing from the scope and spirit of the invention.

What is claimed is:

1. An air conditioning system for a room requiring cooling, comprising:
    a plurality of fans individually controllable in airflow rate and airflow direction;
    simulation means for performing a simulation in accordance with the temperatures detected at a plurality of predetermined positions in the room and the current airflow rates and airflow directions of the plurality of fans, in order to obtain the temperatures at a plurality of selected positions in the room; and control means for controlling at least one of the airflow rate and airflow direction of at least one selected fan in accordance with the result of said simulation.

2. The system according to claim 1, wherein said fans are underfloor fans to be fitted into the floor of said room.

3. The system according to claim 1, wherein said simulation means obtains temperatures at coordinate positions obtained by dividing the room into a grid.

4. The system according to claim 1, wherein the control means determines whether the temperatures supplied from the simulation means are in a predetermined temperature range and controls a fan covering a position at a temperature out of the predetermined temperature range.

5. The system according to claim 4, wherein the control means includes a table including data showing the fans and areas covered with the fans, and the control means determines whether the temperatures supplied from the simulation means are in a predetermined temperature range, and controls a fan covering a position at a temperature out of the predetermined temperature range in accordance with said table.

6. An air conditioning system for a room including a plurality of computer system units, comprising:

plurality of fans individually controllable in airflow rate and airflow direction, a plurality of temperature sensors provided at a plurality of predetermined positions in the room;

simulation means for performing a simulation in accordance with the temperatures detected by the temperature sensors and the current airflow rates and airflow directions of the fans, in order to obtain the temperatures at a plurality of selected positions in the room; and control means for controlling at least one of the airflow rate and airflow direction of at least one selected fan in accordance with the result of the simulation.

7. The system according to claim 6, wherein the fans are underfloor fans to be fitted into the floor of the room.

8. The system according to claim 6, wherein said simulation means obtains temperatures at coordinate positions obtained by dividing the room into a grid.

9. The system according to claim 6, wherein said control means determines whether the temperatures supplied from the simulation means are in a predetermined temperature range and controls a fan covering a position at a temperature out of the predetermined temperature range.

10. The system according to claim 9, wherein said control means includes a table including data showing the fans and areas covered with the fans, and said control means determines whether the temperatures supplied from the simulation means are in a predetermined temperature range, and controls a fan covering a position at a temperature out of the predetermined temperature range in accordance with the table.

11. An air conditioning method for a room including a plurality of computer system units, comprising the steps of:

providing a plurality of fans individually controllable in airflow rate and airflow direction;

detecting temperatures at a plurality of predetermined positions in the room by a plurality of temperature sensors arranged at the positions;

performing a simulation in accordance with the temperatures detected by the temperature sensors and the current airflow rates and airflow directions of the fans, in order to obtain the temperatures at a plurality of selected positions in the room; and controlling at least one of the airflow rate and airflow direction of at least one selected fan in accordance with the result of the simulation.

12. The method according to claim 11, wherein the fans are underfloor fans to be fitted into the floor of the room.

13. The method according to claim 11, wherein the simulation step obtains temperatures at coordinate positions obtained by dividing the room into a grid.

14. The method according to claim 11, wherein the step of controlling determines whether the temperatures obtained in the simulation step are in a predetermined temperature range and controls a fan covering a position at a temperature out of the predetermined temperature range.

15. The method according to claim 14, wherein the step of controlling controls a fan covering a position at a temperature out of the predetermined temperature range in accordance with a table including data showing the fans and areas covered with the fans.

* * * * *